United States Patent
O'Toole et al.

(10) Patent No.: US 11,067,437 B2
(45) Date of Patent: Jul. 20, 2021

(54) METHOD AND APPARATUS FOR TESTING OPTICAL OUTPUTS

(71) Applicant: Feasa Enterprises Limited, Castletroy (IE)

(72) Inventors: Eamonn O'Toole, Castletroy (IE); Timothy Davern, Castletroy (IE); Michael Crowley, Castletroy (IE)

(73) Assignee: FEASA ENTERPRISES UMSTED, Castletroy (IE)

(*) Notice: Subject to any disclaimer, the term of this patent is extended or adjusted under 35 U.S.C. 154(b) by 158 days.

(21) Appl. No.: 15/432,583

(22) Filed: Feb. 14, 2017

(65) Prior Publication Data
US 2017/0234727 A1  Aug. 17, 2017

(30) Foreign Application Priority Data
Feb. 16, 2016 (GB) .................... 1602711

(51) Int. Cl.
*G01J 1/42* (2006.01)
*B60Q 11/00* (2006.01)
(Continued)

(52) U.S. Cl.
CPC .............. *G01J 1/4228* (2013.01); *B60Q 1/38* (2013.01); *B60Q 11/007* (2013.01);
(Continued)

(58) Field of Classification Search
CPC .......... G01J 1/4228; G01J 1/42; G01J 1/0425; B60Q 11/007; G01R 31/2635
(Continued)

(56) References Cited

U.S. PATENT DOCUMENTS

| 4,808,815 A | 2/1989 | Langley |
| 7,056,000 B2 * | 6/2006 | Hussey .............. G01R 31/2635 250/208.1 |

(Continued)

FOREIGN PATENT DOCUMENTS

| DE | 102012224323 | 6/2014 |
| EP | 2388605 | 11/2011 |

(Continued)

OTHER PUBLICATIONS

United Kingdom Search Report dated Jul. 21, 2016, 3 pages.
(Continued)

*Primary Examiner* — Georgia Y Epps
*Assistant Examiner* — Kevin Wyatt
(74) *Attorney, Agent, or Firm* — Dority & Manning, P.A.

(57) ABSTRACT

A method comprising optically detecting optical output states of a plurality of light sources of an optical device over a test interval; for each light source, optically detecting that the output state of the light source has changed from a first optical condition to a second optical condition; for each light source, optically detecting that the output state of the light source has changed from the second optical condition to a third optical condition; for each light source, determining a first time interval representative of the first optical condition; for each light source, determining a second time interval representative of the second optical condition; for each light source, determining a third time interval representative of the third optical condition; determining a test result for the device based on a comparison of the first, second and third time intervals with pre-stored time intervals.

7 Claims, 8 Drawing Sheets

(51) Int. Cl.
   *G01R 31/26* (2020.01)
   *B60Q 1/38* (2006.01)
   *G01J 1/04* (2006.01)
(52) U.S. Cl.
   CPC .............. *G01J 1/0425* (2013.01); *G01J 1/42* (2013.01); *G01R 31/2635* (2013.01); *G01J 2001/4247* (2013.01); *G01J 2001/4252* (2013.01)
(58) Field of Classification Search
   USPC ...................................................... 250/208.2
   See application file for complete search history.

(56) References Cited

U.S. PATENT DOCUMENTS

| | | | | |
|---|---|---|---|---|
| 7,786,678 | B2 * | 8/2010 | Kurt | H05B 45/22 |
| | | | | 315/158 |
| 7,812,624 | B1 | 10/2010 | Wei et al. | |
| 7,964,839 | B1 * | 6/2011 | Langley | G01J 1/02 |
| | | | | 250/214 R |
| 9,155,155 | B1 * | 10/2015 | Ho | H05B 45/22 |
| 2004/0135595 | A1 * | 7/2004 | Chen | G01R 31/2635 |
| | | | | 324/750.05 |
| 2006/0000963 | A1 * | 1/2006 | Ng | G01J 1/32 |
| | | | | 250/205 |
| 2008/0197300 | A1 * | 8/2008 | Kayser | G01J 1/02 |
| | | | | 250/504 R |
| 2010/0188004 | A1 * | 7/2010 | Baggen | H04B 10/1141 |
| | | | | 315/209 R |
| 2011/0133769 | A1 * | 6/2011 | Chen | G01R 31/2635 |
| | | | | 324/762.07 |

FOREIGN PATENT DOCUMENTS

| | | |
|---|---|---|
| EP | 3272585 | 2/2018 |
| WO | WO 2014/095176 | 6/2014 |

OTHER PUBLICATIONS

European Search Report from EP 17155369 dated Jun. 28, 2017, 8 pages.
European Exam Report from EP 17155369 dated Mar. 17, 2020, 4 pages.

* cited by examiner

METHOD AND APPARATUS FOR TESTING OPTICAL OUTPUTS

FIELD

This specification relates to testing optical outputs, such as the optical outputs of a device comprising a plurality of light emitting diodes (LEDs).

BACKGROUND

It is sometimes necessary to test optical output devices in order to check that the devices comply with certain output requirements. Such testing is generally carried out using digital logic analysers which use electrical contacts with the device under test to determine performance parameters of the device.

SUMMARY

This specification provides a method comprising:
 optically detecting optical output states of a plurality of light sources of an optical device over a test interval;
 for each light source, optically detecting that the output state of the light source has changed from a first optical condition to a second optical condition;
 for each light source, optically detecting that the output state of the light source has changed from the second optical condition to a third optical condition;
 for each light source, determining a first time interval representative of the first optical condition;
 for each light source, determining a second time interval representative of the second optical condition;
 for each light source, determining a third time interval representative of the third optical condition;
 determining a test result for the device based on a comparison of the first, second and third time intervals with pre-stored time intervals.

Determining the first time interval may comprise determining an interval between a first predetermined time and the change from the first optical condition to the second optical condition.

The first predetermined time may be a test start time.

Determining the second time interval may comprise determining an interval between the change from the first optical condition to the second optical condition and the change from the second optical condition to the first optical condition.

Determining the third time interval may comprise determining an interval between the change from the second optical condition to the third optical condition and a second predetermined time.

The second predetermined time may be a test end time.

Determining the change from the first optical condition to the second optical condition may comprise comparing a parameter of received light to a predetermined threshold value.

Determining the change from the second optical condition to the third optical condition may comprise comparing a parameter of received light to a predetermined threshold value.

The first optical condition may comprise a first light intensity and the second optical condition may comprise a second light intensity.

The first optical condition may comprise a first colour of light and the second optical condition may comprise a second colour of light.

The method may comprise collecting light emitted by the plurality of light sources of the optical device and guiding the light to a plurality of optical detectors.

The method may comprise generating signals corresponding to parameters of the light guided to the optical detectors.

The third optical condition may correspond to the first optical condition.

The specification also provides a computer program comprising computer executable instructions which, when executed by a computer processor, cause the method to be performed.

The specification also provides a computer readable medium containing computer executable instructions which, when executed by a computer processor, cause the method to be performed.

The specification also provides an apparatus comprising means for performing the method.

The specification also provides an apparatus comprising:
 a light source analyser comprising at least one processor and at least one memory;
 a plurality of light guides configured to guide light collected from a plurality of light sources of an optical device to the light source analyser;
 wherein the processor is configured to execute computer executable instructions stored in the memory to:
 optically detect optical output states of a plurality of light sources of an optical device over a test interval;
 for each light source, optically detect that the output state of the light source has changed from a first optical condition to a second optical condition;
 for each light source, optically detect that the output state of the light source has changed from the second optical condition to a third optical condition;
 for each light source, determine a first time interval representative of the first optical condition;
 for each light source, determine a second time interval representative of the second optical condition;
 for each light source, determine a third time interval representative of the third optical condition;
 determine a test result for the device based on a comparison of the first, second and third time intervals with pre-stored time intervals.

The processor may be configured to execute computer executable instructions stored in the memory to perform the method.

The specification also provides a method comprising:
 optically monitoring an optical output state of a plurality of light sources of an optical device over a predetermined interval;
 determining a time-varying pattern of changes in the optical output states of the plurality of light sources over the predetermined interval;
 comparing the determined time-varying pattern with a pre-stored time-varying pattern of changes in optical outputs states of a plurality of light sources;
 outputting a result for the optical device based on the comparison of the determined time-varying pattern with the pre-stored time-varying pattern.

The at least one aspect may be a temporal aspect of the pattern.

The at least one aspect may be a light intensity aspect of the pattern.

The at least one aspect may be a light colour aspect of the pattern.

The method may comprise storing the determined time-varying pattern in a memory.

The method may comprise determining whether aspects of the determined pattern correspond to aspects of the pre-stored pattern.

The result may indicate whether at least one aspect of the determined pattern corresponds to an aspect of the pre-stored pattern.

The method may comprise identifying the determined time-varying pattern based on the comparison of the determined time-varying pattern with the pre-stored time-varying pattern.

The specification also provides a computer program comprising computer executable instructions which, when executed by a computer processor, cause the method above to be performed.

The specification also provides a computer readable medium containing computer executable instructions which, when executed by a computer processor, cause the method above to be performed.

The specification also provides an apparatus comprising means for performing the method above.

The specification also provides an apparatus comprising:
a light source analyser comprising at least one processor and at least one memory;
a plurality of light guides configured to guide light collected from a plurality of light sources of an optical device to the light source analyser;
wherein the processor is configured to execute computer executable instructions stored in the memory to:
optically monitor an optical output state of a plurality of light sources of an optical device over a predetermined interval;
determine a time-varying pattern of changes in the optical output states of the plurality of light sources over the predetermined interval;
compare the determined time-varying pattern with a pre-stored time-varying pattern of changes in optical outputs states of a plurality of light sources;
output a result for the optical device based on the comparison of the determined time-varying pattern with the pre-stored time-varying pattern.

The processor may be configured to execute computer executable instructions stored in the memory to perform the method above.

The specification generally provides a non-contact method to test and/or measure the sweep function of light sources such as emitting diodes (LEDs) in an optical indicator device. This may be achieved by measuring each LED simultaneously and continuously, and storing the results in memory. The results may then be analysed and the key parameters to be tested may be determined and output to a testing system.

The specification also provides a non-contact method to test and/or measure the blinking rate and the flicker rate of light sources such as LEDs.

The specification also provides a non-contact method to learn patterns generated by light sources such as LEDs. Measured patterns may be stored in memory and compared against unknown patterns measured from another optical device, such as a device under optical testing. The result of the comparison may determine which of the stored patterns identifies the unknown pattern.

The specification also provides a non-contact method to verify the temporal behaviour of each individual light source within an array of light sources.

The optical behaviour of the light sources may be analysed and verified over time and as a function of time.

The method may verify that the array of light sources complies with ECE and SAE automotive optical specifications.

The method may measure the blinking rate of light sources and/or the flicker rate of light sources.

The method may measure, record and analyse complex light patterns generated by light sources.

The method may detect faults or defects optically that are not detectable by electrical methods.

BRIEF DESCRIPTION OF THE FIGURES

For the purposes of example only, embodiments are described below with reference to the accompanying figures, in which.

DETAILED DESCRIPTION

Figure 1:
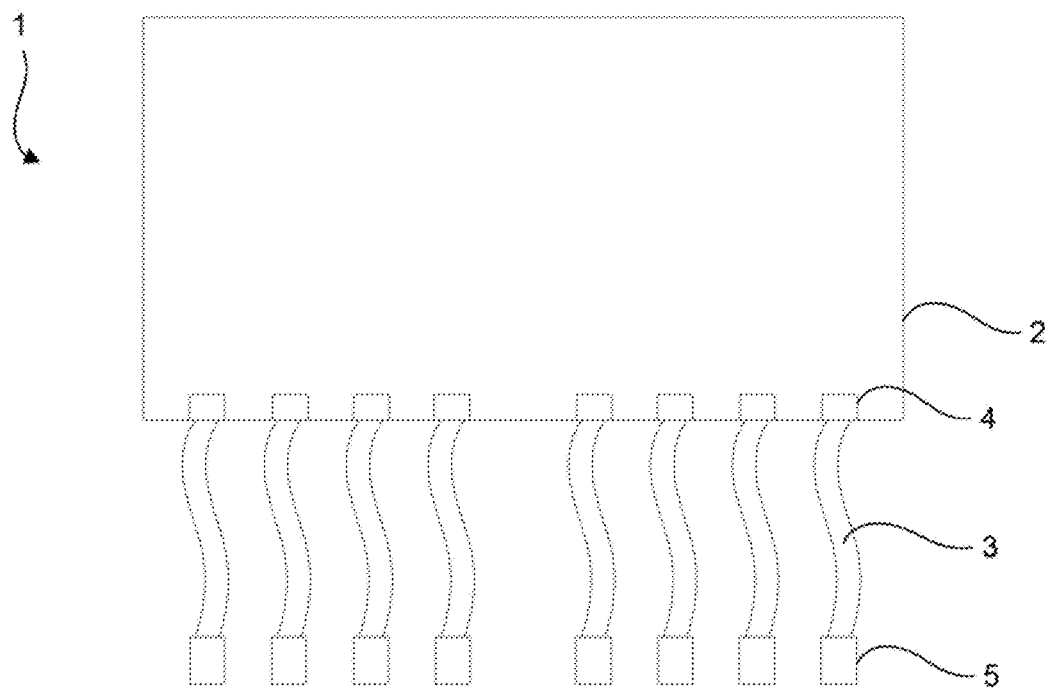
FIG. 1 is a schematic illustration of an apparatus for testing an optical device, comprising a light source analyser and a plurality of optical guides.

FIG. 1 illustrates an example of an apparatus 1 for testing the optical output of an optical device. The apparatus 1 comprises a light source analyser 2 and a plurality of light guides 3 for guiding light to the light source analyser 2. The light guides 3 may, for example, each comprise an optical fibre. A first end of each light guide 3 is connected to the light source analyser 2. For example, the first end of each light guide 3 may be connected to an optical port 4 of the light source analyser 2 so that light in the light guide 3 is guided to the optical port 4. As shown in FIG. 1, the light source analyser 2 may comprise a separate optical port 4 for each light guide 3 connected to the light source analyser 2.

The apparatus 1 also comprises a plurality of optical heads 5 configured to collect light output from an optical device. As shown in FIG. 1, an optical head 5 is connected to the second end of each of the plurality of light guides 3 so that light collected by the optical head 5 enters the light guide 3 to which the optical head 5 is connected. A separate optical head 5 is provided for each light guide 3. Light collected by the optical heads 5 is guided to the optical ports 4 of the light source analyser 2 by the light guides 3.

Figure 2:
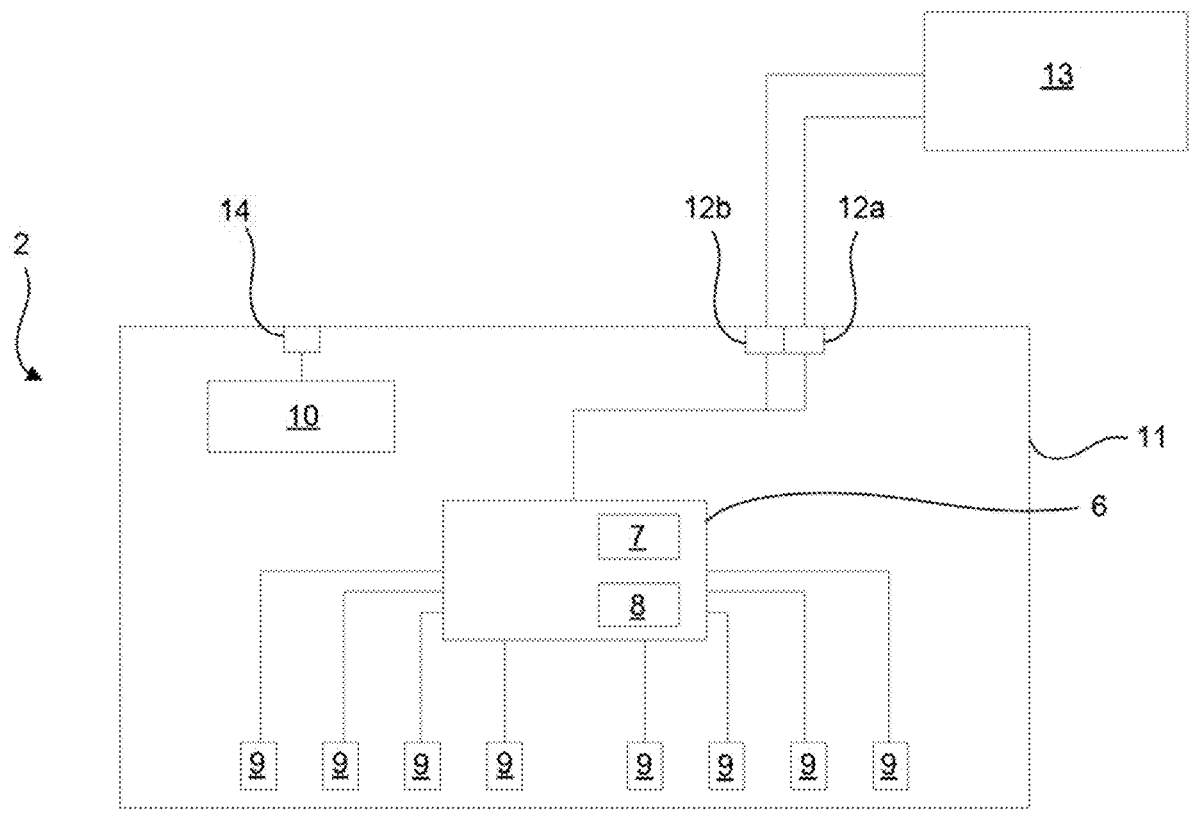
FIG. 2 is a schematic diagram of a light source analyser.

A schematic diagram of the light source analyser 2 is shown in FIG. 2. The light source analyser 2 comprises an electronic controller 6, such as a microcontroller, which controls the operation of the analyser 2. The controller 6 may comprise at least one computer memory 7 and at least one computer processor 8 which is configured to run computer programs stored in the memory or memories 7. Additionally the controller 6 may be communicatively coupled to at least one external memory, for example in a portable computing or memory device, such that the processor(s) 8 may run programs stored in the external memory. An external memory of this type may be inside or outside of the light source analyser 2. Examples of computer memories and computer processor(s) are described in detail below. The computer program(s) cause the processor(s) 8 to analyse light received at the optical ports 4 from the light guides 3. For example, the processor(s) 8 may be caused by the computer program(s) to determine parameters of the light received at the optical ports 4 and to use these parameters to determine a result for the received light, as described below.

The light source analyser 2 further comprises a plurality of transducers 9. A transducer 9 is located at each of the optical ports 4 described above. A separate transducer 9 is provided for each optical port 4. Each transducer 9 is arranged to receive light guided to its associated optical port 4 by the light guide 3 which is connected to the port 4. Each transducer 9 is configured to generate an electrical signal based on the light which is incident on the transducer 9 at its associated port 4. The electrical signal produced by each transducer 9 contains information about the parameters of the light received from the relevant light guide 3. These parameters include the wavelength, frequency and intensity of the received light. It will be appreciated that other parameters can also be determined from the electrical signal, such as the colour of the received light. The transducers 9 are each configured to generate an electrical signal in a continuous manner over a period of time, such that the time-varying characteristics of the electrical signals correspond to the time-varying parameters of the light received from the light guides 3. Changes in the characteristics of the light received from each particular light guide 3 are reflected by changes in the characteristics of the electrical signal produced by the relevant transducer 9, such that over time the signal from each transducer 9 provides a record of any changes in the characteristics of the light received at the transducer 9 from its associated light guide 3. This includes a record of when such changes occurred and, if there were multiple changes, how long the periods between the changes were. In particular, as described in detail below, the signals can provide a complete record of changes in the characteristics of the light received at the transducers 9 over a predetermined optical test interval.

The transducers 9 are communicatively coupled to the controller 6, for example by a suitable electrical connection, such that the signals generated by the transducers 9 are sent to, and received by, the controller 6. The controller 6 is configured to analyse the signals to determine the optical parameters of the light received from each light guide 3 over time. The time-varying parameters of the light may be stored in memory 7 by the controller 6 and used by the controller 6 to determine a result for the received light. An example of such a result is a pass or fail indicator. The pass or fail indicator may be related to an external optical device from which the light was collected by the optical heads 5, as described in detail below.

Referring again to FIG. 2, the light source analyser 2 further comprises a power source 10, which is configured to supply electrical power to the electrical components of the analyser 2. Such components include, but are not limited to, the controller 6, the memories 7, the processors 8 and the transducers 9 discussed above. The power source 10 may comprise a mains power adaptor which is configured to receive electrical power from a mains power source and supply electrical power to the electrical components of the analyser 2. The power source 10 may be configured to perform transformations of mains voltage and current in order to feed appropriate electrical power to the components of the analyser 2, as required.

The light source analyser 2 further comprises a protective exterior housing 11, such as a housing formed from suitable plastics. A moulded construction may be used. The housing 11 may comprise physical connectors for connecting the light guides 3 described above to the optical ports 4. These connectors may be releasable, so that the light guides 3 can be removed from the analyser 2 if required, e.g. for replacement. Alternatively, the connections between the light guides 3 and the optical ports 4 of the analyser 2 may be permanent.

As shown in FIG. 2, the housing 11 incorporates at least one data output port 12a of the light source analyser 2. The data output port 12a is for transferring data from the light source analyser 2 to an external computing device 13, such as a PC or other computer. Such a data transfer may, for example, involve the controller 6 outputting data from the memories 7 to the data output port 12a so that the data can be transferred to the external device 13 for further analysis or long term storage. Similarly, the housing 11 may incorporate at least one data input port 12b of the light source analyser 2. The data input port 12b is for transferring data from an external computing device 13, as described above, to the light source analyser 2. This data transfer may, for example, involve a software update to the controller 6, such as new instructions for analysing signals from the transducers 9. An example of a suitable port 12a, 12b for inputting and/or outputting data to/from the light source analyser 2 is a USB port. It will be appreciated that the data input port 12a and the data output port 12b may be embodied as a single physical port. The housing 11 also incorporates the optical ports 4 discussed above and may additionally comprise other types of port, such as a power port 14 for releasably coupling the power supply 10 of the analyser 2 to a mains power supply.

Figure 3:
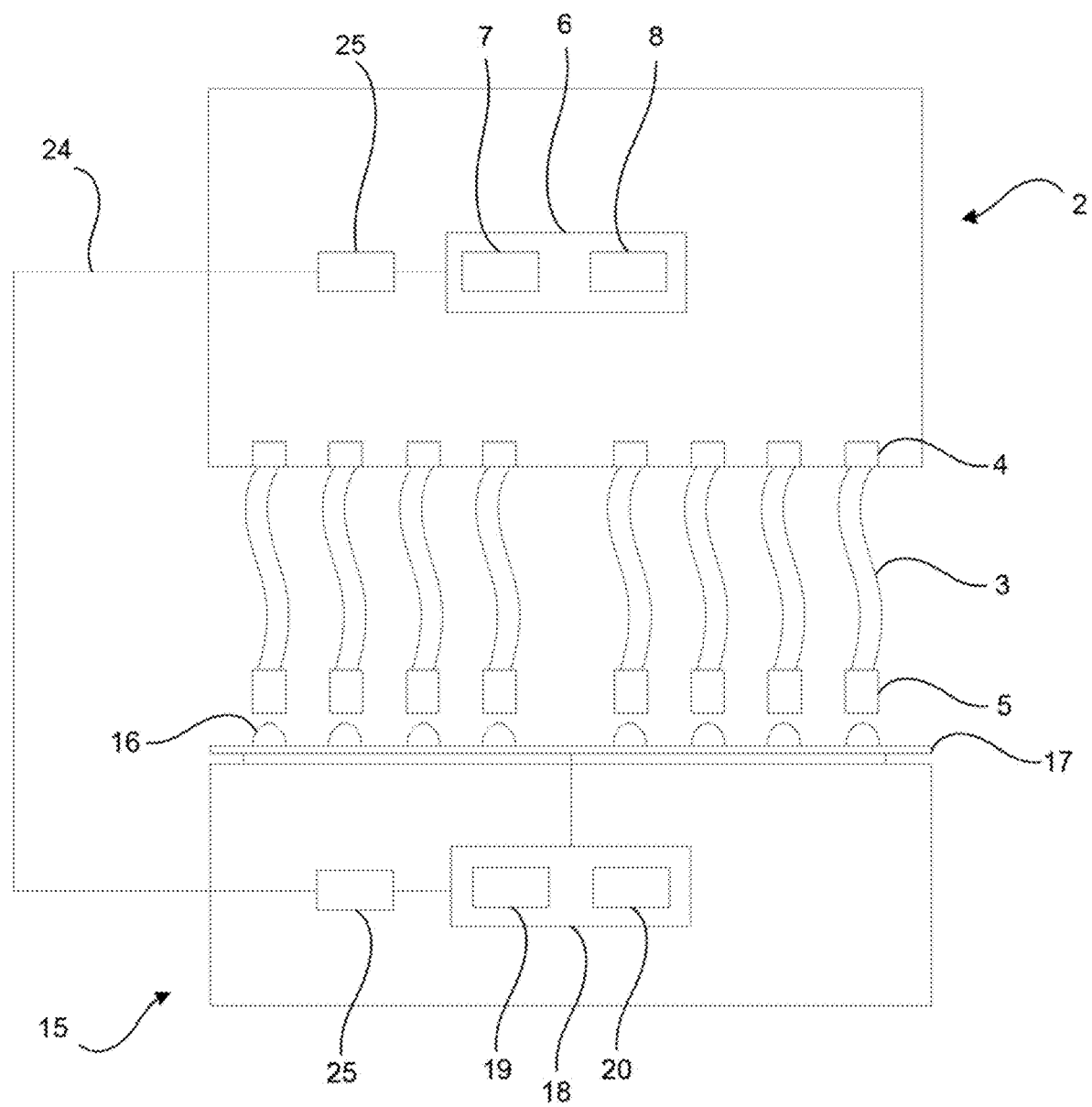
FIG. 3 is a schematic illustration of an apparatus for testing an optical device and an optical device under test by the apparatus.

FIG. 3 shows an example of the light source analyser 2 arranged to receive light from an optical output device 15. The optical output device 15 comprises a plurality of light sources 16 which are each configured to output light with a time varying characteristic. The light sources 16 may each comprise one or more light emitting diodes (LEDs). The light sources 16 are arranged in an array so that they form a particular pattern on the device 15. As shown in FIG. 3, the light sources 16 are each connected to a printed circuit board (PCB) 17 of the optical output device 15, which is in turn communicatively coupled to a controller 18 of the device 15. The controller 18 may be a microcontroller comprising at least one processor 19 and at least one memory 20. The controller 18 is configured to control the optical output of each light source 16 in the device 15 by generating appropriate control signals. These control signals are routed to the light sources 16 via the PCB 17. The control signals may, for example, be based on computer readable instructions stored in the memory 20 of the controller 18.

The controller 18 of the optical output device 15 is configured to individually control each of the light sources 16 to transition between different optical output states. An example of two different optical output states is an ON state and an OFF state. A light source 16 in an ON state outputs light whereas a light source in an OFF state does not output light. It will be appreciated that there are also other types of optical output states which the light sources 16 can adopt under the control of the controller 18. Examples of these output states include different light colour outputs or different light intensity outputs, or any combination of colour output and intensity output.

Referring again to FIG. 3, the plurality of light guides 3 connected to the light source analyser 2 may be positioned so that the optical head 5 at the end of each light guide 3 collects light from a particular one of the plurality of light sources 16 on the optical output device 15. For example, as shown in FIG. 3, the optical head 5 at the end of each light guide 3 may be arranged to be adjacent to a particular light source 16 on the PCB 17. The head 5 collects light predominately from the light source 16 which it is adjacent to and feeds the collected light into the light guide 3 for detection by the transducer 9 in the connected optical port 4 of the analyser 2. A separate optical head 5 and light guide 3 is provided for each light source 16 of the device 15 so that the optical performance of each light source 16 can be separately measured and analysed by the analyser 2.

It will be appreciated that the optical output state of a light source 16 does not necessarily correspond to the optical output state selected for the light source 16 by the controller 18. For example, a control signal which is configured to control a particular light source 16 to operate in an ON state may not ultimately cause the light source 16 to operate in an ON state. The discrepancy between the optical output state of the light source 16 and the optical output state specified for the light source 16 in the control signal from the controller 18 may be due, for example, to a fault in the device 15. An example of a first type of fault is where there is a fault in the device 15 outside the light source 16. For example, an electrical contact which is necessary for control signals to reach a particular light source 16, or a group of light sources 16, may be broken or otherwise not functioning correctly. Similarly, there may be a fault with the supply of electrical power to a particular light source 16 or group of light sources 16.

An example of a second type of fault is where there is a fault in a light source 16. For example, a light source 16 may be damaged or may contain a manufacturing fault which means it does not output light as it should. There are a large number of different possible consequences of such faults, ranging from a full loss of electrical power (no light output) to slight differences between the intended and actual optical outputs of the light source 16. Such differences may, for example, be manifested as problems with the output colour or output intensity of the light source 16. Any discrepancies between the intended optical output states of the light sources 16 and the actual optical output states of the light sources 16 can result in the optical output device 15 as a whole not performing correctly, e.g. by outputting misleading or otherwise inappropriate optical signals. This is undesirable.

The light source analyser 2 provides functionality for testing optical devices 15 to identify such faults.

An example of an optical output device 15 which can be tested by the light analyser 2 is an optical signalling device for a vehicle, such as a vehicle turning indicator. As will be appreciated, vehicle turning indicators are used to provide a visual indication to other road users that a vehicle is turning left or right. Turning indicators may additionally perform other functions, such as providing hazard warnings to other road users, and so may operate in different modes depending on the function selected. Recent developments in automobile design have involved use of dynamic turning indicators, which are able to signal to other road users in a more sophisticated manner than conventional blinking-type indicators. A dynamic turning indicator device comprises a plurality of light sources 16 in the form of LEDs mounted on a PCB 17, as shown in FIG. 3. The LEDs are controlled by a controller 18 to create a dynamic, temporally changing pattern indicating the direction of turn to other road users and interested parties such as pedestrians. The temporally changing pattern indicates the direction of turn more clearly than blinking-type indicators.

A dynamic turning indicator device 21 is illustrated in FIGS. 4A-G. This device 21 is an example of the optical output device 15 shown in FIG. 3 and includes the components of the optical output device 15 described above. The dynamic indicator device 21 is configured to display a progressive "sweeping" or "wiping" pattern in the direction of turn. The progressive pattern is created by a plurality of light sources in the form of LEDs 22 spaced across the device 21. The LEDs 22 output light in temporally separate and consecutive stages to create an effect of light progressing across the device 21 in the direction of turn. The progressive indicator device 21 may comprise, for example, approximately 30 LEDs 22. The LEDs 22 may comprise a plurality of groups of LEDs, or LED segments, which are sequentially activated to create the progressive effect described above. For example, the device 21 shown in FIGS. 4A-G comprises 30 LEDs divided into ten separate LED groups, or segments 23. These LED segments 23, which each comprise at least one LED 22, are independently activated by the controller 18 of the device 22 to emit visible light. The segments 23 are also independently deactivated by the controller 18 so as to cease emitting visible light. The segments 23 may be activated with predetermined time periods between the activation of each segment 23. An example of such a time period is 150 ms.

Figure 4A:
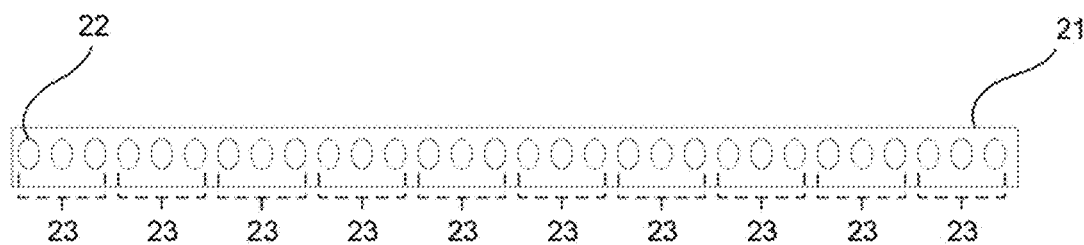
FIG. 4A is a schematic illustration of a dynamic turning indicator device in an initial stage of outputting a turn signal.
Figure 4B:
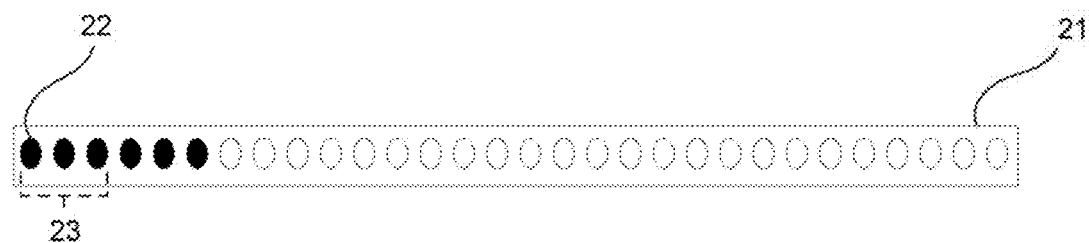
FIG. 4B is a schematic illustration of a dynamic turning indicator device in a first intermediate stage of outputting a turn signal.

FIG. 4A illustrates the dynamic turning indicator device 21 in a first optical output stage. The first optical stage corresponds to an initial condition $C_1$, at a first point in time $t_1$. In this condition $C_1$ no turn signal is being given by the device 21. The LEDs 22 are all in an OFF state, in which no light is emitted. FIG. 4B illustrates the dynamic turning indicator device 21 in a second optical stage. The second optical stage corresponds to a first intermediate sweeping condition $C_2$, at a second point in time $t_2$. In this condition $C_2$ a turn signal has begun to be given by the device 21. A first portion of the LEDs 22 are in an ON state, in which visible light is emitted. This first portion may correspond, for example, to first and second segments 23 of LEDs 22. A second portion of the LEDs 22 are in an OFF state, in which no light is emitted. This second portion may correspond to the remaining segments 23 of LEDs 22.

Figure 4C:
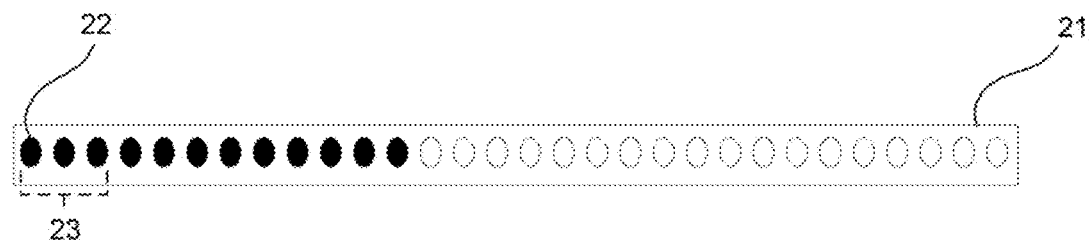
FIG. 4C is a schematic illustration of a dynamic turning indicator device in a second intermediate stage of outputting a turn signal.
Figure 4D:
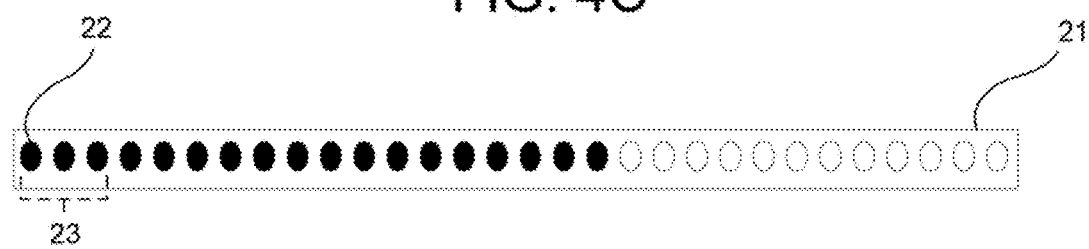
FIG. 4D is a schematic illustration of a dynamic turning indicator device in a third intermediate stage of outputting a turn signal.
Figure 4E:
FIG. 4E is a schematic illustration of a dynamic turning indicator device in a fourth intermediate stage of outputting a turn signal.
Figure 4F:
FIG. 4F is a schematic illustration of a dynamic turning indicator device in a fifth intermediate stage of outputting a turn signal.
Figure 4G:
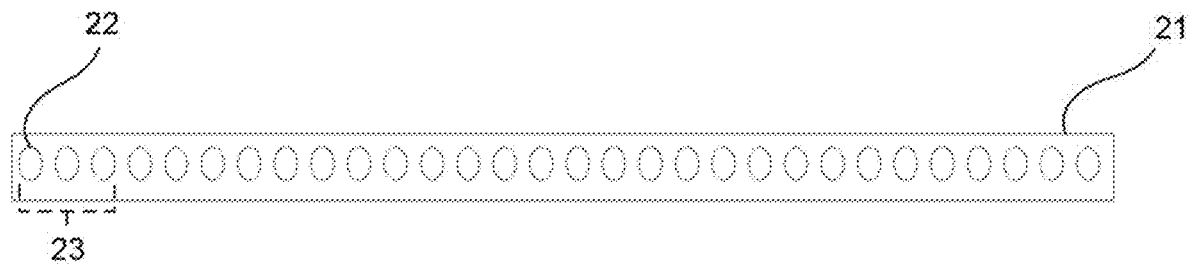
FIG. 4G is a schematic illustration of a dynamic turning indicator device in a final stage of outputting a turn signal.

FIG. 4C illustrates the dynamic turning indicator device 21 in a third optical stage. The third optical stage corresponds to a second intermediate sweeping condition $C_3$, at a third point in time $t_3$. In this condition $C_3$ the turn signal has progressed further than the second stage discussed above. The portion of the LEDs 22 in an ON state has grown in a direction across the LED array (i.e. at least one further segment 23 of LEDs 22 is ON). The portion of the LEDs 22 in an OFF state has shrunk (i.e. at least one fewer segment 23 of LEDs 22 is OFF). FIG. 4D illustrates the dynamic turning indicator device 21 in a fourth optical stage. The fourth optical stage corresponds to a third intermediate sweeping condition $C_4$, at a fourth point in time $t_4$. In this condition $C_4$ the turn signal has progressed further than the third stage discussed above. The portion of the LEDs 22 in an ON state has grown further in a direction across the LED array. The portion of the LEDs 22 in an OFF state has shrunk further. FIG. 4E illustrates the dynamic turning indicator device 21 in a fifth optical stage. The fifth optical stage corresponds to a fourth intermediate sweeping condition $C_5$, at a fifth point in time $t_5$. In this condition $C_5$ the turn signal has progressed further than the fourth stage discussed above. The portion of the LEDs 22 in an ON state has grown further in a direction across the LED array. The portion of the LEDs 22 in an OFF state has shrunk further. FIG. 4F illustrates the dynamic turning indicator device 21 in a sixth optical stage. The sixth optical stage corresponds to a fifth intermediate sweeping condition $C_6$, at a sixth point in time $t_6$. In this condition $C_6$ the turn signal has progressed further than the fifth stage discussed above. The portion of the LEDs 22 in an ON state has grown in a direction across the LED array so that all LEDs 22 are now in an ON state (e.g. all segments 23 are ON). FIG. 4G illustrates the dynamic turning indicator device 21 in a seventh optical stage. The seventh optical stage corresponds to a final condition $C_7$, at a seventh point in time $t_7$. In this condition $C_7$ the turn signal has been completed and all LEDs 22 are in an OFF state. The LEDs 22 remain in an OFF state for a time interval $t_8$-$t_7$. This allows either for a repeat of the first to sixth optical stages outlined above by resetting from the first point in time $t_1$, or for the dynamic indicator device 21 to be switched off to cease signalling.

Figure 5:
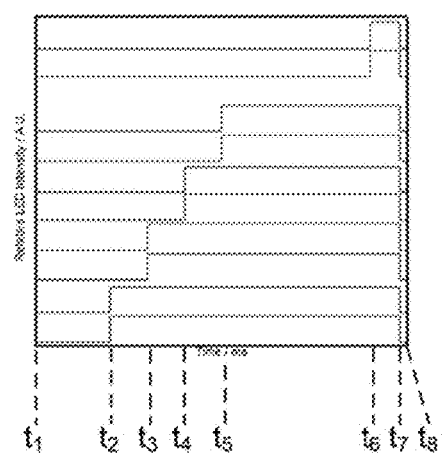
FIG. 5 is a timing diagram of time-varying intensity outputs of light sources in a dynamic turning indicator device when outputting a turn signal.

FIG. 5 is a timing diagram of the action of the dynamic turning indicator device 21 shown in FIGS. 4A-G. FIG. 5 illustrates the optical output intensities of the ten segments 23 of LEDs 22 as a function of time. The various sweeping conditions $C_1$-$C_7$ shown in FIGS. 4A-G can be seen between the initial time $t_1$ and the end time $t_8$.

As with many automotive products and applications, the characteristics of such progressive indicator devices 21 are defined in regional automotive specifications, such as those for the Economic Commission for Europe (ECE) and SAE International (EU and USA respectively). In particular, the timing pattern for the activation of LEDs or other light sources to make a sweeping indicator pattern is determined by ECE and SAE standards. In order to ensure that these standards are complied with, the lighting pattern produced by any particular progressive indicator device 21 must be tested to verify that the indicator function produced in the factory meets the relevant regional specification. In the case of progressive indicator devices 21, this type of test is different to previous LED testing at least in that it has a time dependent function. This requires a more sophisticated measurement than previous LED colour and brightness tests, which can be carried out in a single measurement. The light source analyser 2 described herein permits testing of such progressive indicator devices 21, as well as testing of other types of optical output devices 15, in a manner which is time and resource efficient. This allows very large numbers of such devices 15 to be tested in a short amount of time, making it practicable to ensure that all manufactured devices 15 comply with the relevant regional standards before they are installed in road-going vehicles.

A method of testing the optical output of a dynamic indicator device 21 with a progressive indicator function is described below with respect to FIG. 6. The testing method is carried out using the light source analyser 2. The method is also applicable to other types of optical output device 15.

Figure 6:
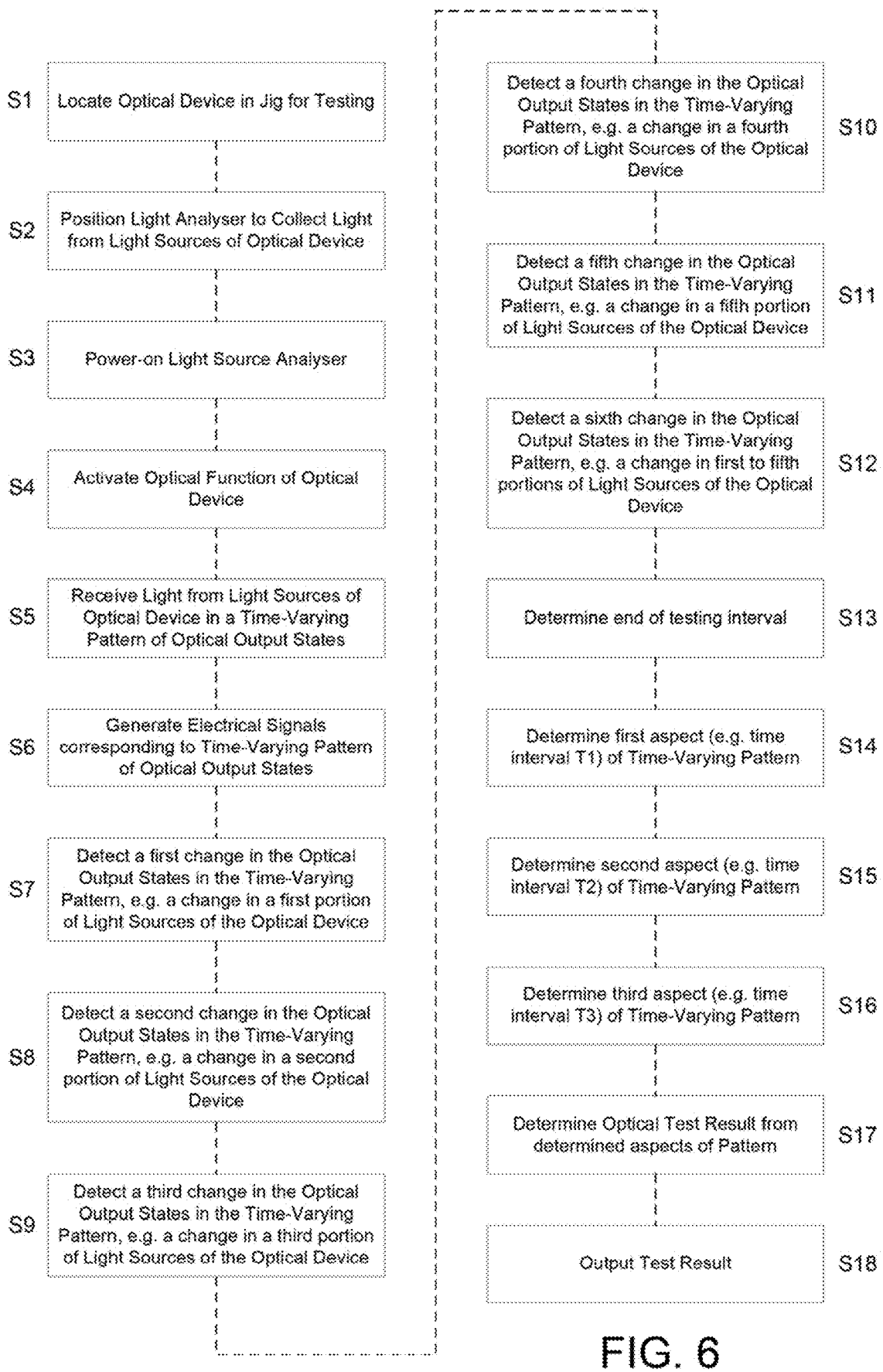
FIG. 6 is a flow diagram of a method for testing the optical output of an optical device such as a dynamic turning indicator device.

Referring to FIG. 6, in a first step S1 of the testing method the dynamic indicator device 21 is positioned in a testing jig (not shown). The jig is designed to secure the dynamic indicator device 21 in a testing orientation so that light emitted by the light sources 16 in the device 21, in this case LEDs 22, can be collected by the optical heads 5 discussed above.

In a second step S2, the plurality of light guides 3 connected to the light source analyser 2 are positioned adjacent to the plurality of LEDs 22 on the PCB 17 of the dynamic indicator device 21. This step S2 may optionally take place as part of the first step S1 of positioning the indicator device 21 in the test jig. As previously described, an individual light guide 3 and connected optical head 5 may be provided for each LED 22 in the is device 21. This configuration allows the optical function of each individual LED 22 to be measured at the light source analyser 2 and, therefore, allows optical faults with individual LEDs 22 to be identified at the analyser 2. The positioning of the optical heads 5 on the ends of the light guides 3 can be close to the LEDs 22 on the PCB 17 of the device 21, but not in contact with the LEDS 22. For example, the distance between the optical heads 5 on the ends of the light guides 3 and the LEDs 22 in the dynamic indicator device 21 may be between 0.1 mm and 5 mm.

In a third step S3, the light source analyser 2 is powered-on so that it is in a state ready to receive, detect and analyse light outputs from the LEDs 22. It will be appreciated that this third step S3 could alternatively take place as the second or first step of the testing method.

In a fourth step S4, the dynamic indicator device 21 is activated so that the progressive indicator function described above begins. The light source analyser 2 is simultaneously informed of this activation of the indicator function and, in response, triggers activation of an internal timer so that the optical output of the indicator device 21 can be monitored over, and mapped to, a predetermined test interval. The light source analyser 2 may be informed automatically of the activation of the indicator function by a communication connection 24 between the light source analyser 2 and the indicator device 21, as shown in FIG. 2.

This communication connection 24 is separate from the light guides 3 and optical heads 5 described above and may, for example, comprise a wired or wireless communicative coupling between the controllers 6, 18 of the light source analyser 2 and the dynamic indicator device 21. One example is for the light source analyser 2 to communicatively couple to the dynamic indicator device 21 using a wireless communication protocol such as Bluetooth® upon the indicator device 21 being positioned in the jig. In this scenario, the analyser 2 and the indicator device 21 comprise appropriate communication hardware 25 connected to their controllers 6, 18, including wireless communication aerials, in order to facilitate wireless communication. Alternatively, the data input port 12b of the analyser 2 could be coupled by a physical communication lead to a corresponding port of the dynamic indicator device 21. In both cases, the communication connection 24 allows the indicator device 21 to signal to the analyser 2 when its indicator function is triggered.

The timer of the light source analyser 2 may be implemented by executing appropriate software stored in the memory 8 of the controller 6. The timer begins at the initial time $t_1$ shown in FIG. 5 and allows the controller 6 to monitor and record time-stamped changes in the optical output characteristics of the LEDs 22 in the indicator device 21 over the predetermined test interval. The test interval may, for example, correspond to the time interval between the initial time $t_1$ and the final time $t_8$ taken for the indicator function to progress from the first to the final optical stages outlined above. Alternatively, the test interval may correspond to two or more multiplies of the time $t_8$ taken for the indicator function to progress from the beginning of the first optical stage to the end of the final optical stage.

In a fifth step S5, the light source analyser 2 receives light from the LEDS 22 in a time-varying pattern of optical output states. Starting at the first point in time $t_1$ referred to above, the optical output states of the LEDs 22 are varied by the controller 6 to output light for testing by the light source analyser 2 over the duration of the predetermined test interval. In this example, the optical output intensities of each LED 22 are switched between OFF and ON in a predetermined pattern, as previously described. This step S5 is best considered in the context of the seven temporally sequential output conditions $C_1$-$C_7$ of the device 21 described above in relation to FIGS. 4 and 5. It will be understood from the discussion above that the optical output of each LED 22 follows an OFF-ON-OFF sequence over the duration of the test interval, with different segments 23 of LEDs 22 spending different amounts of time in each optical state.

In a sixth step S6, which occurs simultaneously with the fifth step S5, the transducers 9 of the light source analyser 2 generate electrical signals based on light captured by the optical heads 5 and guided to the optical ports 4 by the light guides 3. The electrical signals correspond to the time-varying pattern of optical output states of the LEDs 22. The electrical signals are communicated to the controller 6 of the light source analyser 2 in the manner previously described. The transducers 9 may output electrical signals regardless of whether or not light from the LEDs 22 is being received at the transducers 9. In other words, the signal generated by each transducer 9 reflects not only the optical characteristics of light emitted by a particular LED 22 when it is in an ON state, but also the lack of light emitted by the LED 22 when it is in an OFF state. As described above, in all but one of the seven optical output stages of the indicator device 21 described above with respect to FIGS. 4 and 5, at least one of the LEDs 22 is in such an OFF state.

In a seventh step S7, the light source analyser 2 detects a first change in the time-varying pattern of light from the LEDs 22 by detecting a change in the optical output state of a first portion of the LEDs 22. The change is detected from the electrical waveform signals generated at the transducers 9 from light received at the optical ports 4. For example, with reference to FIG. 5, the optical output of the first portion of LED(s) 22 may change from a first optical condition (e.g. OFF) to a second optical condition (e.g. ON) at a particular time $t_2$ after the beginning of the test interval. If the LEDs 22 are operating correctly, the light collected by the optical heads 5 positioned adjacent to each of the first portion of LEDs 22 is significantly increased in this scenario and its receipt by the associated transducers 9 causes a correspondingly significant change in the electrical signal generated by the transducers 9. The change in the electrical signals is detected by the controller 6 of the light source analyser 2, which determines from the change in the signal what aspects of the optical signals received at the transducers 9 have changed. In this example, the change comprises an increase (or decrease) in the intensity of the received light.

The controller 6 is configured to individually detect changes in the optical output states of each of the LEDs 22 from OFF to ON and ON to OFF in a time-varying pattern over the duration of the test interval. It is also the function of the controller 6 to determine the points in time ($t_2$-$t_7$), during the predetermined test interval ($t_1$-$t_8$), at which these changes in optical output state occur. The determination of whether a particular LED 22 is ON or OFF may be made by comparing the light intensity indicated by the electrical signal from the relevant transducer 9 with a predetermined threshold intensity stored in the memory 7 of the controller 6. The controller 6 may determine that the optical output state of the LED 22 is ON if the intensity indicated by the signal from the transducer 9 is equal to or above the threshold. Conversely, the controller 6 may determine that the optical state of the LED 22 is OFF if the intensity indicated by the signal from the transducer 9 is below the threshold.

Therefore, in the context of testing the progressive indicator function of the dynamic indictor device 21 shown in FIGS. 4A-4G, the seventh step S7 comprises the controller 6 determining that the first and second segments 23 of LEDs 22 have changed from an OFF state to an ON state. This occurs after a first time period $t_2$, as previously described with respect to FIG. 5. The controller 6 records the changes in the optical output states of the LEDs 22 concerned in the memory 7, along with the time $t_2$ at which the changes occurred. It will be appreciated from the previous discussion that the recordal of the optical output states of all LEDs 22 in the array may take place continuously over the predetermined test interval, and therefore that recordal of the changes referred to above (and those referred to below in the eighth to twelfth steps S8-S12) takes place alongside the controller 6 simultaneously recording the optical output states of all other LEDs 22 in the array.

In an eight step S8, the light source analyser 2 detects a second change in the time-varying pattern of light from the LEDs 22 by determining that the third and fourth segments 23 of LEDs 22 have changed from an OFF state to an ON state. This occurs after a second time period $t_3$, as previously described with respect to FIG. 5. The controller 6 records the changes in the optical output states of the LEDs 22 concerned in the memory 7, along with the time $t_3$ at which the changes occurred.

In a ninth step S9, the light source analyser 2 detects a third change in the time-varying pattern of light from the LEDs 22 by determining that the fifth and sixth segments 23 of LEDs 22 have changed from an OFF state to an ON state. This occurs after a third time period $t_4$, as previously described. The controller 6 records the changes in the optical output states of the LEDs 22 concerned in the memory 7, along with the time $t_4$ at which the changes occurred.

In a tenth step S10, the light source analyser 2 detects a fourth change in the time-varying pattern of light from the LEDs 22 by determining that the seventh and eighth segments 23 of LEDs 22 have changed from an OFF state to an ON state. This occurs after a fourth time period $t_5$, as previously described. The controller 6 records the changes in the optical output states of the LEDs 22 concerned in the memory 7, along with the time $t_5$ at which the changes occurred.

In an eleventh step S11, the light source analyser 2 detects a fifth change in the time-varying pattern of light from the LEDs 22 by determining that the ninth and tenth segments 23 of LEDs 22 have changed from an OFF state to an ON state. This occurs after a fifth time period $t_6$, as previously described. The controller 6 records the changes in the optical output states of the LEDs 22 concerned in the memory 7, along with the time $t_6$ at which the changes occurred.

In an twelfth step S12, the light source analyser 2 detects a sixth change in the time-varying pattern of light from the LEDs 22 by determining that all of the segments 23 of LEDs 22 have changed from an ON state to an OFF state. This occurs after a sixth time period $t_7$, as previously described. The controller 6 records the changes in the optical output states of the LEDs 22 in the memory 7, along with the time $t_7$ at which the changes occurred.

In a thirteenth step S13, the controller 6 determines that the predetermined test interval has ended. This may occur after a seventh period of time $t_8$ since the beginning of the test interval $t_1$, as shown in FIG. 5, or may occur after two or more multiples of the seventh period of time $t_8$ to allow the characteristics of multiple "sweeps" (repeated) to be detected by the analyser 2.

The first to thirteenth steps S1-S13 therefore comprise optically monitoring an optical output state of the LEDs 22 in the indicator device 21 over the predetermined test interval, between the test start time $t_1$ and the test end time $t_8$. For each LED 22, the method involves optically detecting that the output state of the LED 22 has changed from a first optical condition (OFF) to a second optical condition (ON). This is followed by, for each LED 22, optically detecting that the output state of the LED 22 has changed from the second optical condition (ON) back to the first optical condition (OFF). The next steps of the method are discussed below with reference to FIG. 7, as well as FIGS. 5 and 6.

In a fourteenth step S14, the light source analyser 2 determines a first temporal aspect of the time-varying pattern of light from the LEDs 22. The controller 6 determines, for each LED 22, a first time interval T1 between the test start time $t_1$ and the change from the first optical condition (OFF) to the second optical condition (ON). This time interval T1 varies depending on the position of the LED 22 in the array. For example, in FIG. 5, the first time interval T1 for the first and second segments 23 of LEDs 22 corresponds to the interval between the beginning of the test $t_1$ and the second point in time $t_2$. Similarly, the first time interval T1 for the third and fourth segments 23 of LEDs 22 corresponds to the interval between the beginning of the test $t_1$ and third point in time $t_3$. The determination of the time interval T1 for each LED 22 is made from the signals recorded from the transducers 9 in the earlier steps of the method.

In a fifteenth step S15, the light source analyser 2 determines a second temporal aspect of the time-varying pattern of light from the LEDs 22. The controller 6 determines, for each LED 22, a second time interval T2 between the change from the first optical condition (OFF) to the second optical condition (ON) and the change from the second optical condition (ON) back to the first optical condition (OFF). For example, in FIG. 5, the second time interval T2 for the first and second segments 23 of LEDs 22 corresponds to the interval between the second point in time $t_2$ and the seventh point in time $t_7$. Similarly, the second time interval T2 for the third and fourth segments 23 of LEDs 22 corresponds to the interval between the third point in time $t_3$ and the seventh point in time $t_7$. As with the first time intervals T1, the determination of the time interval T2 for each LED 22 is made from the waveform signals recorded from the transducers 9 in the earlier steps of the method.

In a sixteenth step S16, the light source analyser 2 determines a third temporal aspect of the time-varying pattern of light from the LEDs 22. The controller 6 determines, for each LED 22, a third time interval T3 between the change from the second optical condition (ON) to the first optical condition (OFF) and the end of the predetermined test interval $t_8$. For example, in FIG. 5, the third time interval T3 for all segments 23 of LEDs 22 corresponds to the interval between the seventh point in time $t_7$ and the end of the test interval $t_8$.

It will be appreciated that although the first, second and third time intervals T1-T3 referred to above have been described in a sequential manner where the sum of the test time intervals T1-T3 is equal to the total test interval $t_8$, the first, second and third time intervals T1-T3 could alternatively each be determined from the beginning of the test interval $t_1$. In these circumstances, for example, the second time interval T2 for the first segment 23 would correspond to the period between the beginning of the test interval $t_1$ and the seventh point in time $t_7$, rather than the difference between the seventh point in time $t_7$ and the second point in time $t_2$.

It will be understood from the description above that the controller 6 is configured to process the optical waveform data represented by the electrical signals from the transducers 9 in order to allow the optical output of each LED 22 to be described by as a time-varying pattern of optical output changes. In particular, the method allows the optical output of each of the LEDs 22 in the indicator device 21 to be described by three scalar values. These values are the durations in milliseconds of the first, second and third time intervals T1-T3, describing the initial OFF time T1, the ON time T2 and the secondary OFF time T3 of each LED 22. In this format, the description of the time-varying pattern of changes in the optical output states of the LEDs 22 requires only a very small amount of data. This data can be very rapidly transferred to, and stored in, an external device if required.

The overall time taken to output a test result for the device 21 is greatly reduced by the on-board calculations described above. The overall time taken to output a test result is an important production parameter when one considers that thousands of devices 21 need to be tested daily in high volume production. If the full waveform data had to be transferred from the analyser 2 to an external computer, the transfer process would add significant extra time before the data could be processed and then, ultimately, reduced to a pass/fail indication.

In a seventeenth step S17, the controller 6 is configured to determine a test result for the indicator device 21 by comparing the aspects of the time-varying pattern determined in the steps S1-S16 above with corresponding aspects of one or more pre-stored time-varying patterns in the memory 8 of the light source analyser 2. In particular, the controller is configured to determine a test result for the indicator device 21 based on a comparison of the first, second and third time intervals T1, T2, T3 with corresponding pre-stored time intervals stored in the memory 7. The pre-stored time intervals may correspond, for example, to time intervals specified in a regional standard for progressive turning indicators 21 as indicated above. The determination may comprise comparing the measured first to third time intervals T1-T3 with the corresponding pre-stored time intervals and determining whether the measured intervals T1-T3 sufficiently correspond to the pre-stored intervals. For example, the controller 6 may be configured to determine whether each measured time interval T1-T3 for each LED 22 is within a predetermined percentage of the corresponding pre-stored interval, or within a predetermined amount of time of the corresponding pre-stored interval. If each measured time interval T1-T3 for each LED 22 is found to sufficiently correspond to the pre-stored intervals, the indicator device 21 passes the test. Conversely, if one or more of the measured time intervals T1-T3 is found to not sufficiently correspond to the corresponding pre-stored interval, the indicator device 21 may fail the test. For the reasons given above, the comparison is very light on the processor 7 and therefore very fast and efficient to implement in the analyser 2.

In an eighteenth step S18, the controller 6 is configured to output the test result for the indicator device 21. The test result may be output automatically. For example, the controller 6 may generate a pass or fail signal for transmission to an external computer 13. Additionally or alternatively, the controller 6 may cause a visual indication to be given of the test result. Such a visual indication may comprise, for example, illuminating a suitable light source (not shown) on the outside of the analyser's housing 11.

Figures 7, 8:
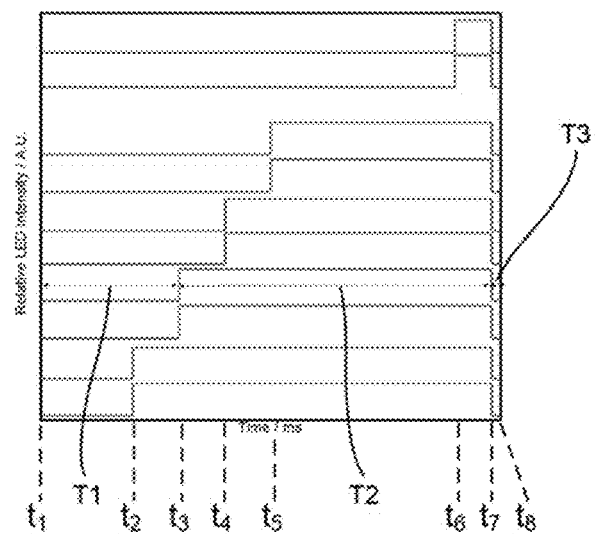
FIG. 7 is a timing diagram of an initial OFF interval, an ON interval and a secondary OFF interval for each of a plurality of light sources in an optical device when outputting a signal, such as a dynamic turning indicator device when outputting a turn signal.
FIG. 8 is a table showing a pattern of changes, in the form of binary values, in the optical output states of a plurality of light sources in an optical device such as a dynamic turning indicator device.

Another example of a time-varying pattern of changes in the optical output states of a plurality of LEDs 22 is shown in FIG. 8. The LEDs 22 follow an OFF-ON-OFF sequence of changes in optical output state, as discussed above with respect to FIGS. 5 and 7. Consistent with the discussion above, FIG. 8 shows an optical turn signal sequence output by a plurality of LEDs 22 in a dynamic indicator device 21. LED light received at the transducers 9 is converted to a binary pattern where an ON state of an LED 22 is represented by the value "1" and an OFF state of an LED 22 is represented by the value "0". The binary pattern is stored in the memory 7 of the light source analyser 2 by taking multiple readings as the LEDs 22 cycle through the time-varying pattern, as previously described. In other words the testing interval corresponds to a plurality of multiples of the time period $t_8$ taken for all of the LEDs 22 to cycle from OFF to ON to OFF, as shown in FIGS. 4A to 4G.

Figure 9:
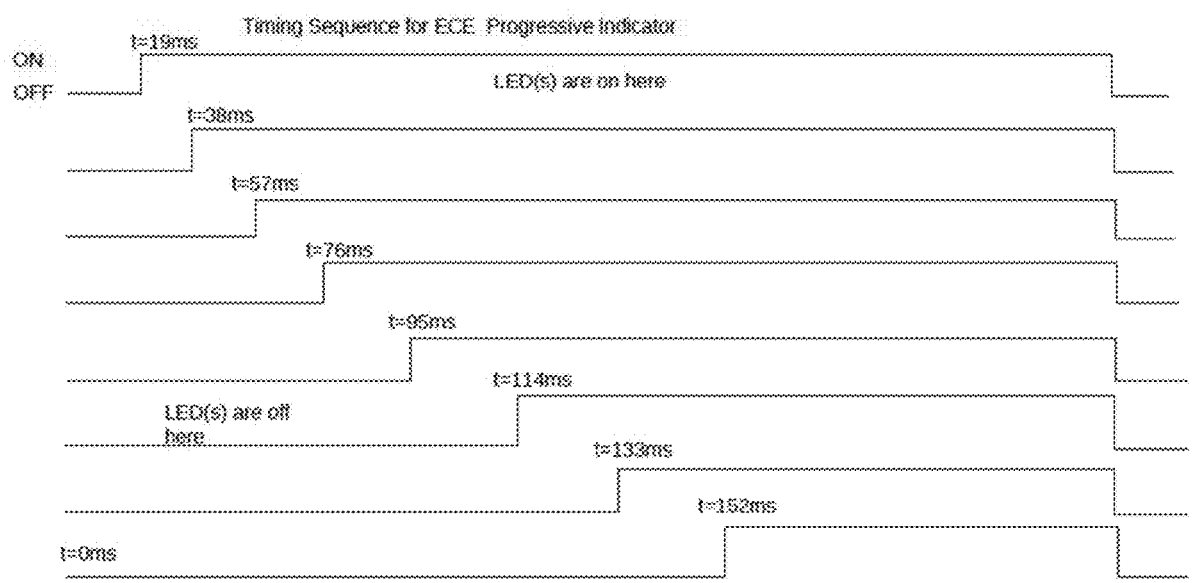
FIG. 9 is a timing diagram of a pattern of changes in the optical output states of a plurality of light sources in a dynamic turning indicator device.

In order to determine the ON/OFF states of the LEDs 22 based on the waveform signals received from the transducers 9, threshold values are compared with the light intensity readings as previously described. The result of the comparison is converted to a binary number to reduce subsequent processing time and load on the processor 8 when determining the test result. Light ramping functions can also be processed or described by varying threshold values. The test result can be determined in the same manner as previously described, by comparing the optically measured characteristics of the temporally varying pattern produced by the LEDs 22 with characteristics of one or more pre-stored temporally varying patterns to determine whether the patterns sufficiently correspond. If there is sufficient correspondence the patterns are determined to match. FIG. 9 illustrates a timing sequence for the optical output states shown in FIG. 8. The timing between the changes in LED output states shown in FIG. 9 is in accordance with an ECE standard.

It will be understood from the discussion above that the optical waveform data provided by the transducers 9 to the controller 6 contains not only intensity data for the received light but also colour information and other optical parameters. The determination of a test result for the optical device 15 may be based not only on a comparison of measured time intervals T1-T3 with pre-stored time intervals, as described above, but also on a comparison of a measured colour of the received light with pre-stored colour information. In a similar manner to the time interval comparison, the measured colour of light from individual LEDs 22 may be compared to colours pre-stored in the memory 7 as part of a time-varying pattern of optical outputs. Predetermined thresholds may be used by the controller 6 to determine whether the measured colours sufficiently correspond to the pre-stored colours and, on that basis, a test result may be determined.

Figure 10:
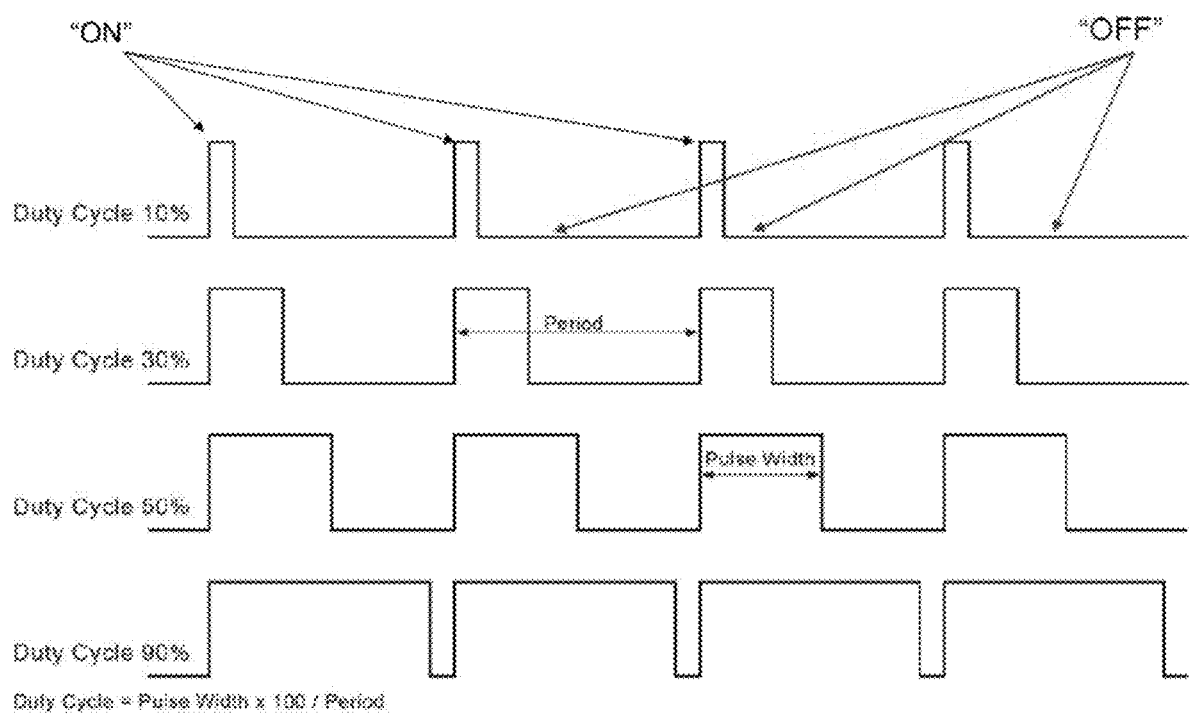
FIG. 10 is a schematic illustration of four different duty cycles for a light source such as an LED.

It will be further understood that the optical waveform data provided by the transducers 9 to the controller 6 also allows other optical properties of the received light/LEDs 22 to be determined. These properties include the duty cycle of the LEDs 22, the blinking/flashing rate of the LEDs 22, and the flicker rate of the LEDs 22. Examples of four different duty cycles are shown in FIG. 10. FIG. 10 shows examples of the control of an LED using PWM (Pulse Width Modulation). PWM is a method of controlling an LED using a fixed current, in which the LED is pulsed on and pulsed off over a single period of time. The brightness of the LED may be controlled by making the on-time longer and the off-time shorter over the period. The duty cycle of the LED is the amount of time the LED spends 'on' in a particular period, expressed as a percentage. In other words, the duty cycle is the ratio of the on-time to the period of the cycle. The examples in FIG. 10, moving down the page, show duty cycles of 10%, 30%, 50% and 90%. In these examples, if the length of the period were one second, the blinking rate/flashing rate would be one blink/flash per second.

The skilled person will understand that flicker of a light source, such as an LED, is a rapid and repeated change over time in the brightness of the light emitted from the light source. Light flicker generally falls into two categories: visible flicker and invisible flicker. Visible flicker is perceivable by the human eye, whereas invisible flicker is not. Light flicker frequencies of 3 Hz to 70 Hz are highly perceptible by humans and can cause discomfort. Higher light flicker frequencies, such as those between 70 Hz and 160 Hz, can cause malaise, headaches and visual impairment.

In addition to comparing measured time-varying parameters of light received from an optical device 15 with pre-stored data to determine a test result for the device 15, as described above, the analyser 2 may be configured to provide additional functionality. For example, the light source analyser 2 may be configured to record the optical output states of the LEDs 22 over a predetermined interval, including any changes in the manner described above, and to store the outputs of each LED 22 in the memory 7 for use in calibration or testing future devices 15. For example, a temporally changing pattern of the optical outputs of the LEDs 22, or other light sources 15, of a device 15 which is known to provide desired optical performance may be measured by the analyser 2 and stored in its memory 7. This pattern may then be used to provide pre-stored time intervals T1-T3 such as those referred to above, or other temporally-dependent optical characteristics, in future optical testing. In particular, the pattern can be used to determine whether another optical device 15 under test complies with test requirements in the manner described with respect to FIG. 6.

A plurality of measured, or otherwise pre-stored, time-varying optical patterns may be stored in the memory 7 of the light source analyser 2. The controller 6 of the analyser 2 may compare these pre-stored patterns against unknown patterns measured from a device 15 under test. The result of the comparison may determine which of the stored patterns matches the optical pattern produced by the optical device 15 under test. In this way, the unknown pattern is identified by the light source analyser 2.

The light source analyser 2 has been predominately described above with respect to a dynamic turning indicator device 21 with a progressive indicator function. However, the analyser 2 could alternatively be used to test the optical function of other types of optical output device 15. Examples of such devices 15 include "welcome" lighting devices for the exteriors of automotive vehicles. "Welcome" lighting of this type is configured to fade in intensity in compliance with certain standards. For example, standards may specify certain rates of fading at specified light intensities and/or colours. The elements of the standard may be stored in the memory 7 of the light source analyser 2 for use in comparison with optical outputs from measured devices 15, as previously described with respect to the dynamic indicator device 21.

Other examples of optical output devices 15 that may be tested using the light source analyser 2 include lighting devices for emergency vehicles such as police cars and fire engines. Further examples include discrete road warning lights and other types of optical alert or optical warning devices such as blinking LED key-fobs. Further examples include internet router devices, which comprise light sources for indicating the internet-connection status of the router and other router functionality.

Computer program(s) stored in the memory cause the processor 7 to analyse light received at the optical ports 4 from the light guides 3 in the manner described above. The processor 7 is caused by the computer program(s) to determine parameters of the light received at the optical ports 4 and to use these parameters to determine a result for the received light. The computer memories 7, or other computer readable storage medium, may comprise, for example, one or more read-only memories (ROMs), random access memories (RAMs), EPROMs, EEPROMs, Flash memories, magnetic or optical cards or application specific integrated circuits (ASICs). Additionally or alternatively, the computer readable storage medium 20 may comprise any type of storage disk, such as one or more floppy disks, optical disks, CD-ROMs and/or magnetic-optical disks, or any other type of media suitable for storing electronic instructions which can be executed by the processors 8. The computer readable storage medium(s) 7 is coupled to the processor 8 and other elements of the controller architecture 6 via a computer system bus. The processor 8 is configured to implement the instructions under the control of the program to operate the light source analyser 2. For example, the controller 6 may be communicatively coupled to a power supply 10 of the analyser 2 so that the controller 6 can control the operation of the analyser 2 as described above. For the avoidance of doubt, the controller 6 may include a single processor or may comprise one or more architectures employing multiple processor designs for increased computing capability.

The term "light" is used above principally in the context of visible light. However, the meaning of the term "light" as used in this specification is not restricted to visible light wavelengths. In particular, the term also encompasses light of infra-red and ultra-violet wavelengths.

Modifications to the apparatus 1 described above could be made without departing from the scope of the claims.

The invention claimed is:

1. A method comprising:
   for each light source of a plurality of light sources of an optical device, collecting light from the light source;
   for each light source, guiding, using a respective light guide of a plurality of light guides, the light to a respective optical port of a plurality of optical ports;
   for each light source, receiving, at a respective transducer of a plurality of transducers, the light guided from the light source to the respective optical port by the respective light guide;
   optically monitoring an optical output state of the plurality of light sources of the optical device over a predetermined interval based on, for each of the plurality of light sources, the light received at the respective transducer;
   determining a sequence of the optical output states of the plurality of light sources over the predetermined interval;
   comparing the determined sequence with a pre-stored sequence of changes in optical output states of the plurality of light sources;
   outputting a result for the optical device based on the comparison of the determined sequence with the pre-stored sequence.

2. The method of claim 1, comprising storing the determined sequence in a memory.

3. The method of claim 1, comprising determining whether aspects of the determined sequence correspond to aspects of the pre-stored sequence.

4. The method of claim 1, wherein the result indicates whether at least one aspect of the determined sequence corresponds to an aspect of the pre-stored sequence.

5. The method of claim 4, wherein the at least one aspect of the determined sequence comprises at least one of:
   a temporal aspect of the determined sequence;
   a light intensity aspect of the determined sequence; and
   a light colour aspect of the determined sequence.

6. The method of claim 1, comprising identifying the determined sequence based on the comparison of the determined sequence with the pre-stored sequence.

7. The method of claim 1, wherein the pre-stored sequence for the optical output states of the plurality of light sources creates an effect of light progressing across the plurality of light sources.

* * * * *